(12) United States Patent
Groenewold (10) Patent No.: US 8,325,453 B2
(45) Date of Patent: Dec. 4, 2012

(54) SHORT-CIRCUIT PROTECTION FOR SWITCHED OUTPUT STAGES

(75) Inventor: Gerrit Groenewold, Ramona, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 569 days.

(21) Appl. No.: 12/542,615

(22) Filed: Aug. 17, 2009

(65) Prior Publication Data
US 2010/0302692 A1    Dec. 2, 2010

Related U.S. Application Data

(60) Provisional application No. 61/182,045, filed on May 28, 2009.

(51) Int. Cl.
*H02H 9/00* (2006.01)
(52) U.S. Cl. ........................................ 361/101
(58) Field of Classification Search .................. 361/101
See application file for complete search history.

(56) References Cited

U.S. PATENT DOCUMENTS

| | | | | |
|---|---|---|---|---|
| 5,159,516 A * | 10/1992 | Fujihira | ............ | 361/18 |
| 5,973,551 A * | 10/1999 | Mitsuda | ............ | 327/543 |
| 5,999,041 A * | 12/1999 | Nagata et al. | ............ | 327/538 |
| 6,768,623 B1 * | 7/2004 | Shen | ............ | 361/93.9 |
| 7,411,376 B2 * | 8/2008 | Zhang | ............ | 323/277 |
| 7,573,689 B2 * | 8/2009 | Hojo | ............ | 361/93.1 |
| 2003/0122530 A1 * | 7/2003 | Hikita | ............ | 323/285 |
| 2007/0069994 A1 * | 3/2007 | Takahashi | ............ | 345/76 |
| 2007/0139839 A1 | 6/2007 | Yoshihara | | |
| 2007/0194768 A1 | 8/2007 | Bansal et al. | | |
| 2008/0290911 A1 * | 11/2008 | Williams | ............ | 327/109 |
| 2009/0039869 A1 * | 2/2009 | Williams | ............ | 324/123 R |

FOREIGN PATENT DOCUMENTS
WO    WO2007036020 A1    4/2007

OTHER PUBLICATIONS

International Search Report and Written Opinion—PCT/US2010/036731, International Search Authority—European Patent Office—Jan. 20, 2011.

* cited by examiner

*Primary Examiner* — Jared Fureman
*Assistant Examiner* — Scott Bauer
(74) *Attorney, Agent, or Firm* — Ramin Mobarhan (57) ABSTRACT

Short-circuit protection in switched output stages is described to protect switching output stages from excessive output current in short-circuit conditions which may cause device damage. Design techniques to attain this goal include measuring currents in switching transistors by placing a scaled transistor in parallel thereto, combined with circuitry for making drain voltages substantially equal. The various techniques for short-circuit protection comprise (a) using a transistor and an operational amplifier in combination, (b) using a single transistor in place of the operational amplifier, (c) using a circuit to generate over-current detection signals, (d) providing over-current detection signals to a driver in order to reduce the output current, (e) using an inverter to feedback regulate output current, (f) using a switch to bypass the current regulator during normal operation, and (g) automatically opening this switch in an over-current situation.

29 Claims, 10 Drawing Sheets

SHORT-CIRCUIT PROTECTION FOR SWITCHED OUTPUT STAGES

Claim of Priority under 35 U.S.C. §119

The present Application for Patent claims priority to Provisional Application No. 61/182,045 entitled "SHORT-CIRCUIT PROTECTION IN SWITCHED OUTPUT STAGES" filed May 28, 2009, and assigned to the assignee hereof and hereby expressly incorporated by reference herein.

TECHNICAL FIELD

The present disclosure related generally to electronics, and more specifically to short-circuit protection for switched output stages.

BACKGROUND

Power efficiency is of paramount importance in mobile devices. To maximize power efficiency, mobile devices utilize high efficiency switching circuitry. High-efficiency operation of switching circuits requires low on-state switch resistance. However, low on-state switch resistance may generate a large output current in the event the output terminal of the switching circuit is short-circuited. Large output currents may cause damage to the switching circuit. Therefore, there is a need to develop a short-circuit protection circuit to be utilized in high-efficiency switching output stage circuits to prevent circuit damage.

Different short-circuit protection circuits may be utilized; however these solution have significant downsides. For example, a protection circuit may be added in series with the output transistor. While this short-circuit protection circuit may prevent short-circuit currents, the addition of a series circuit with the output creates an increase in power dissipation and thus reduces the overall efficiency of the circuit.

Traditionally, digital output stages are switched, while analog output stages are controlled in a continuous fashion. However, there are cases in which it is advantageous to switch analog output stages.

Figure 1:
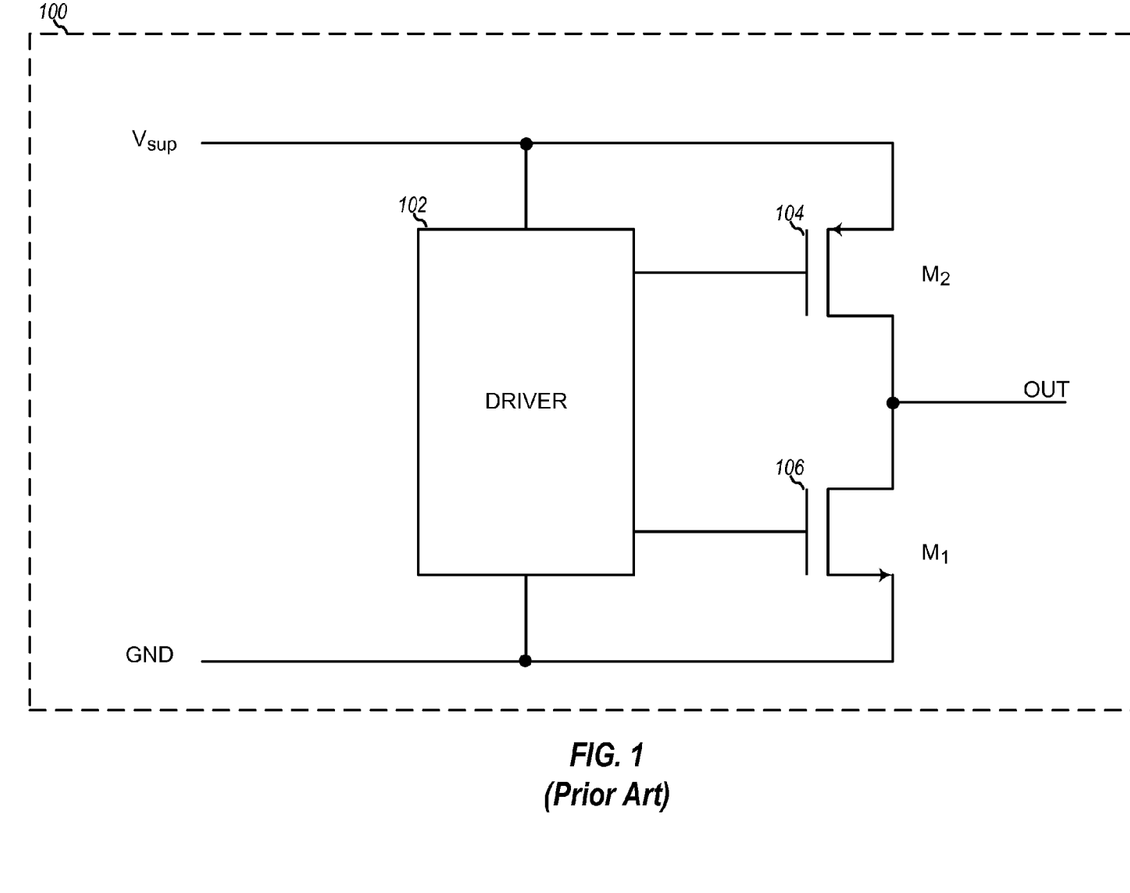
FIG. 1 shows an example of a typical analog switched output stage.

FIG. 1 shows an example of a typical analog switched output stage 100. Switched output stage 100 includes a driver 102 and a complementary pair of output transistors M2 104 and M1 106 configured to drive a load circuit (not shown) that couples to output terminal OUT. An example load circuit is a loudspeaker. Output transistors 104, 106 may, for example, be bipolar junction transistors (BJTs) or metal-oxide field effect transistors (MOSFETs).

It is desirable for a non-switched output stage to be able to accurately establish the current, or the voltage, applied to the load circuit. A known technique to establish accurate analog output currents (or voltages) is to measure the output current (or voltage) at the output terminal OUT, and adjust the gate voltages of the output stage transistors through a feedback loop, until the measured output current (or voltage) reaches a desired value. Because output transistors such as M1, M2 (106, 104) dissipate a significant amount of power—reducing the power delivered to the load—the efficiency of the non-switched output stage is ultimately also reduced.

In a switched output configuration, transistor gate voltages are not accurately adjusted. Rather, the output transistors gate voltages are toggled between a high voltage and low voltage. In case of a NMOS transistor, the transistor is in an on state when the gate voltage is high. Conversely, when a NMOS transistor gate voltage is low the transistor is in an off state. In case of a PMOS transistor, the transistor is in an off state when the gate voltage is high. Conversely, when a PMOS transistor gate is low, the transistor is in an on state. In the on state, the resistance between the drain and the source terminals of the transistor is minimized. This reduction in resistance results in a low voltage across the transistor terminals. The low resistance and low voltage results in low power dissipation in the transistor. The relationship between voltage, current, resistance and power dissipation can be expressed as follows:

$$P = VI = I^2 R \qquad \text{Eq. (1)}$$

In the off state, the resistance between the drain and source terminals of the transistor is maximized. The increase in resistance results in a decrease in current flowing through the transistor. The reduction of transistor current results in low power dissipation. The low power dissipation characteristic during on state and off state of a transistor allow switching circuits to accomplish very low power dissipation and subsequently high power efficiency. An example of a switching circuit is a class-D circuit.

Protecting the stage against short-circuits may be accomplished by measuring and reducing the output current when a given threshold value is observed. A circuit capable of measuring the output current may be coupled in series with the circuit output. However, a series circuit configuration will result in the dissipation of additional power, which would otherwise be delivered to the load circuit. Therefore a series coupled solution will reduce the efficiency of the output stage. Alternatively, coupling a measuring circuit in parallel in order to measure the output current has the drawback that the same circuit does not provide any reduction in the power delivered to the load circuit, and hence cannot protect against a short-circuit condition.

Figure 2:
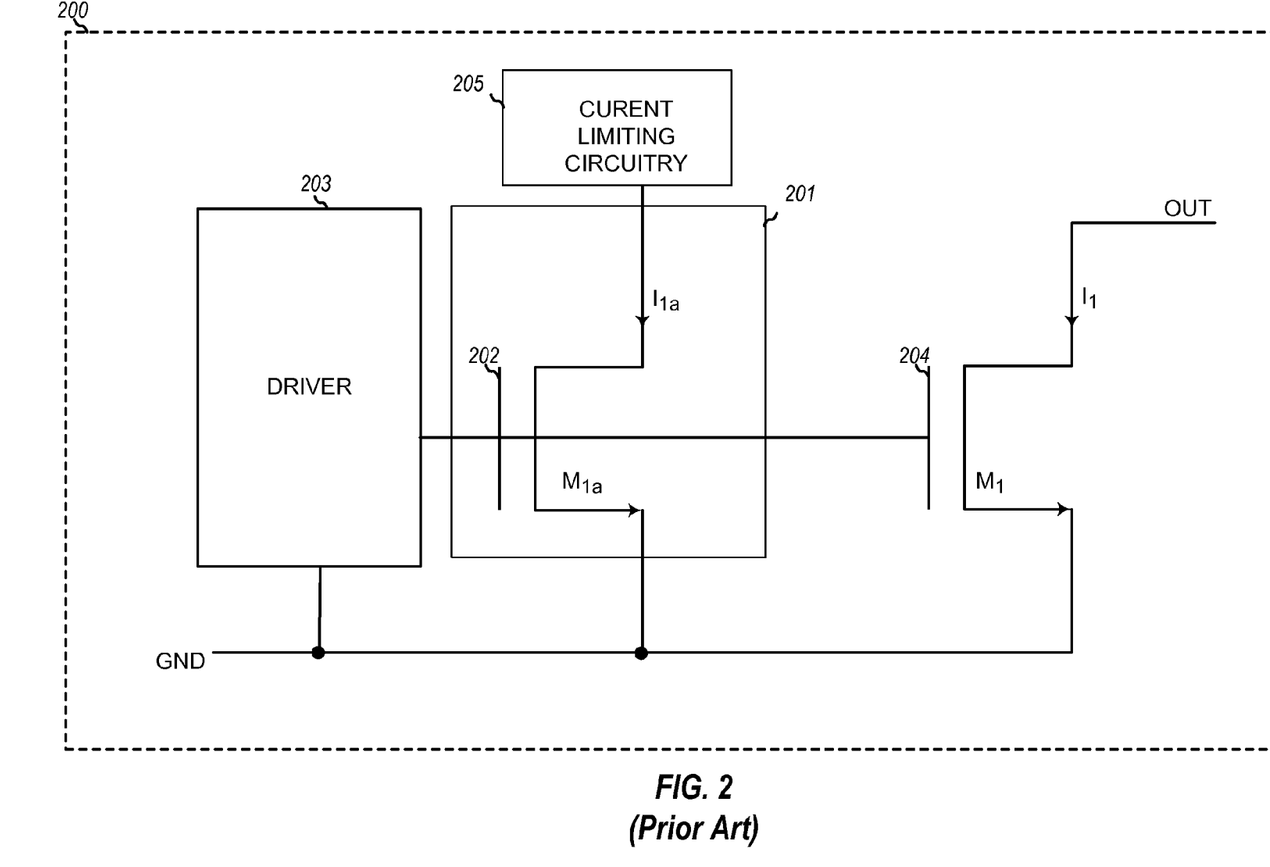
FIG. 2 shows an example of a typical switched output stage with short-circuit protection.

FIG. 2 shows an example of a typical switched output stage 200 with short-circuit protection. Switched output stage 200 includes a driver 203 coupled via short-circuit protection circuit 201 to an output transistor 204. Short-circuit protection circuit 201 includes a reference transistor $M_{1a}$ 202, the gate of which is coupled to the gate of output transistor $M_1$ 204 and the output of driver 203. The gate terminals of transistors $M_{1a}$ 202 and $M_1$ 204 are coupled to the driver output terminal. The source terminals of transistors $M_{1a}$ 202 and $M_1$ 204 are coupled to ground. Transistor $M_{1a}$ 202 is a scaled version of output transistor $M_1$ 204. In saturation region, the current $I_{1a}$ flowing through transistor $M_{1a}$ 202 is a scaled version of current $I_1$ flowing through output transistor $M_1$ 204. Current limiting circuitry 205 is coupled to the drain of reference transistor M1a to limit the current through reference transistor M1a 202 and output transistor M1 204.

The relationship between the output current $I_1$ through transistor M1 204 and the reference current $I_{1a}$ through reference transistor M1a 202 may be expressed as:

$$I_{1a} = I_1 \left( \frac{W_{1a} L_1}{W_1 L_{1a}} \right) \qquad \text{Eq. (2)}$$

When the device is not operating in the saturation region, the current $I_{1a}$ flowing through transistor $M_{1a}$ 202 cannot be accurately scaled to the current $I_1$ flowing through transistor $M_1$ 204. Hence when not operating in the saturation region, the transistor current is instead highly dependent upon the voltage applied across the drain and source terminals of the transistor.

For analog switched output stages, such as may be utilized with class-D stages and capacitive charge pump circuits, where the switching output transistors are not configured to only operate in saturation region, improved short-circuit protection is desired.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Exemplary embodiments of the invention are directed to short-circuit protection in switched output stages. These exemplary embodiments protect switched output stages from excessive output current in short-circuit conditions which may cause device damage.

Design techniques to attain this goal include measuring currents in switching transistors by placing a scaled transistor in parallel thereto, combined with circuitry for making drain voltages substantially equal. The various techniques for short-circuit protection comprise (a) using a transistor and an operational amplifier in combination, (b) using a single transistor in place of the operational amplifier, (c) using a circuit to generate over-current detection signals, (d) providing over-current detection signals to a driver circuit in order to reduce the output current, (e) using feedback to regulate the output current, (f) using a switch to bypass the current regulator during normal operation, and (g) automatically opening this switch in an over-current situation. These and other aspects are described in greater detail in connection with FIGS. 3-10.

Switched output stages as shown can form part of an integrated circuit, or may be a discrete circuit. Similarly, the device protected from damage may be any device that employs a switched output stage, including a device such as wireless communication devices, including mobile devices, laptops, notebooks and the like.

Figure 3:
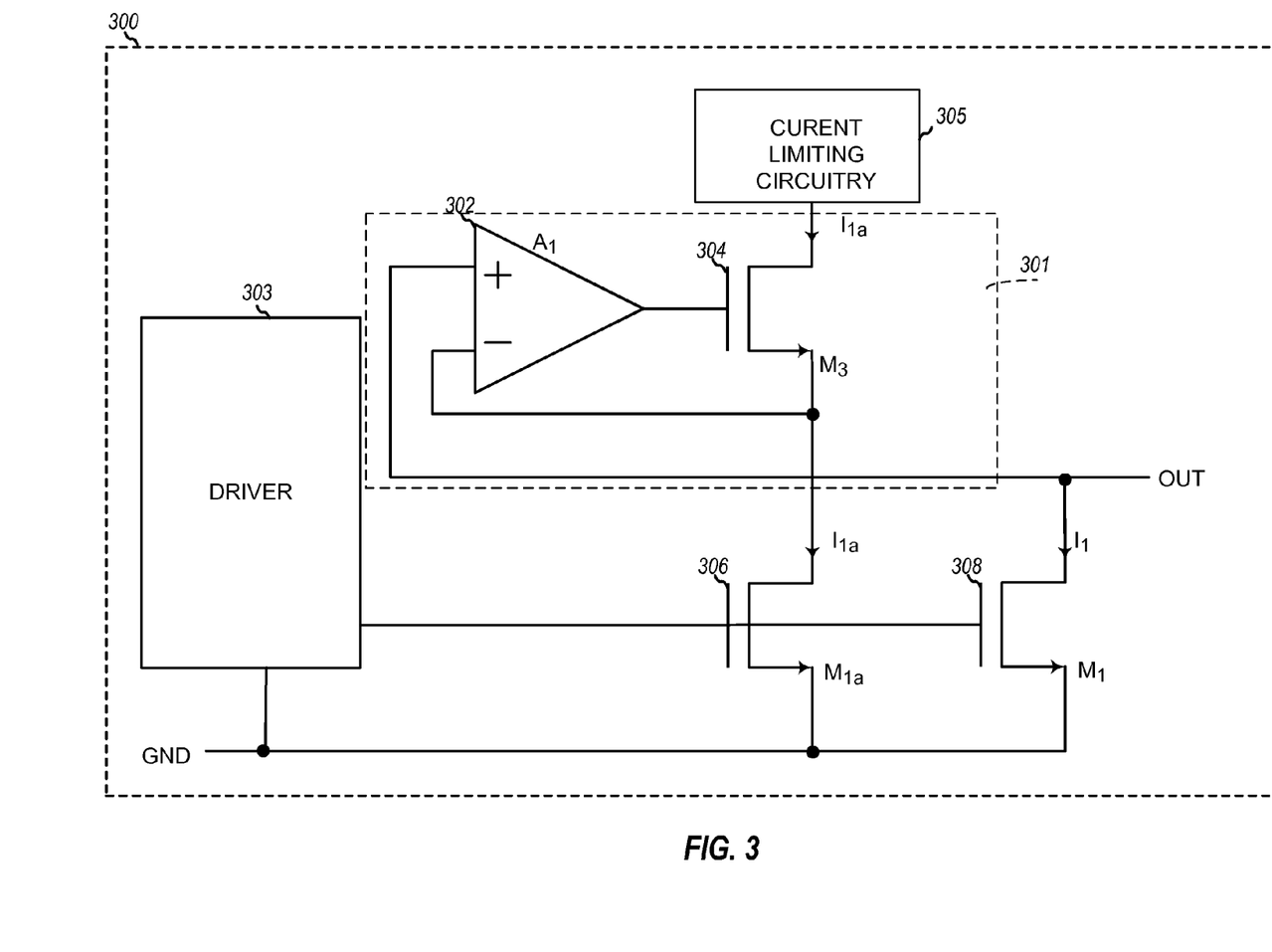
FIG. 3 is a first exemplary embodiment of an analog switched output stage with short-circuit protection.

FIG. 3 is a first exemplary embodiment of a switched output stage 300 with a switched output transistor with short-circuit protection. In accordance with the exemplary embodiment, the switched output transistor may be operated in the non-saturation region and be protected as well as if it were operating in the saturation region.

Switched output stage 300 includes a current detecting transistor M1a 306 coupled to a drain equalization circuit 301, a driver 303, and current limiting circuitry 305 to short-circuit protect output transistor M1 308.

Drain equalization circuit 301 comprises a measuring transistor M3 304 and an operational amplifier A1 302. Drain equalization circuit 301 measures the drain voltage of output transistor M1 308 and applies the measured voltage through a feedback loop to the drain terminal of current detecting transistor M1a 306. In this manner, the drain voltages of both transistor 306 and 308 are set to a similar potential to create a reference current I1a, which is an accurate scaled measure of current I1.

As shown, the output of operational amplifier A1 302 is coupled to the gate terminal of transistor M3 304. The source terminal of transistor M3 304 is coupled to the drain terminal of transistor M1a 306. The drain terminal of transistor M3 304 is coupled to current limiting circuitry 305. The source terminals of transistors M1a 306 and M1 308 are coupled to ground.

Drain voltage equalization circuit 301 is coupled in a manner such that the voltages present at each terminal of the output transistor M1 308 are present at each corresponding terminal of current detecting transistor M1a. This way, even when not operating in the saturation region of the output transistor, adequate short-circuit protection is provided with minimal additional power consumption.

Figure 5:
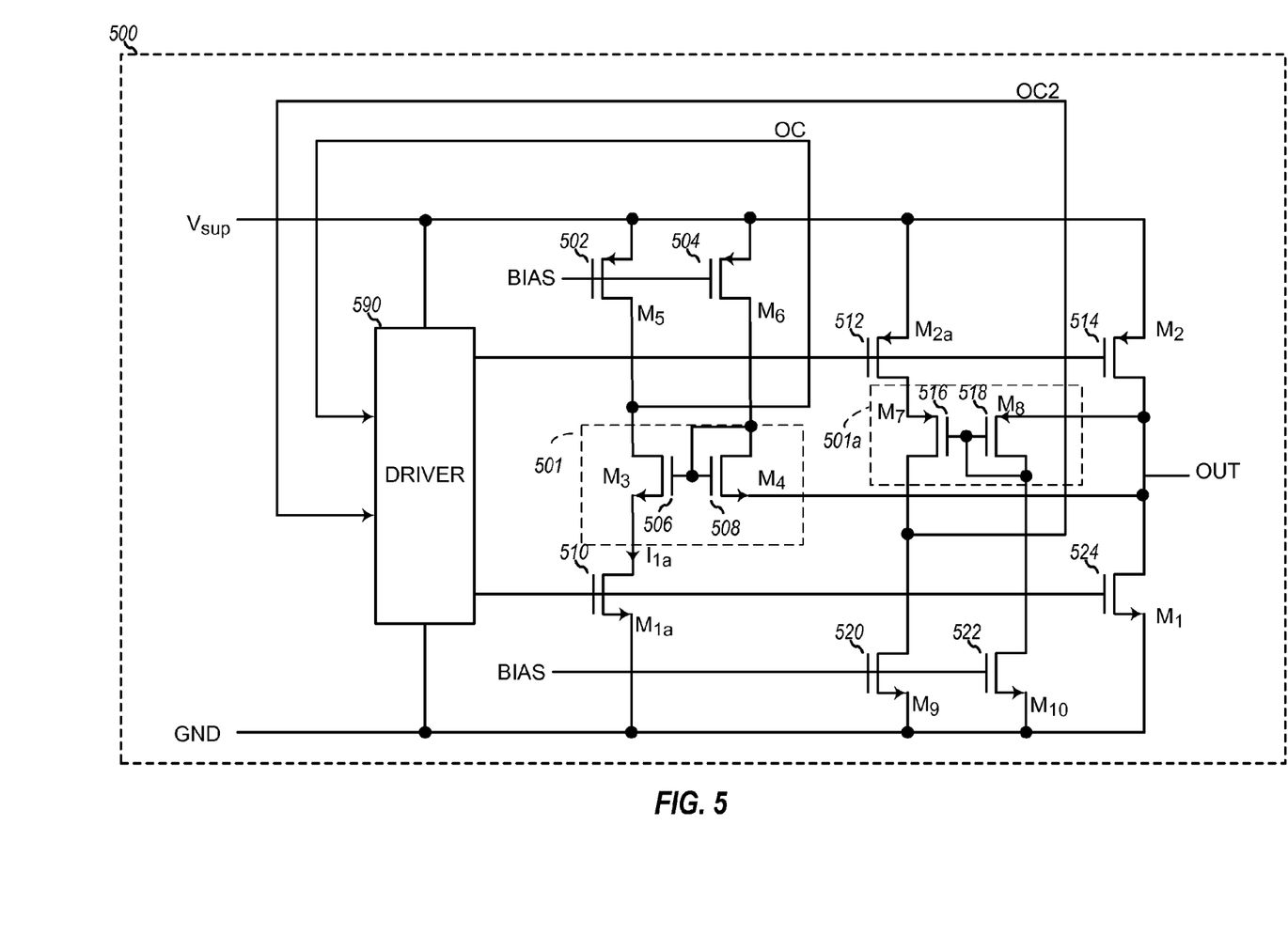
FIG. 5 is a further exemplary embodiment of a switched output stage with two output transistors, where each output transistor is short-circuit protected by a switched output stage configuration similar to that of FIG. 4.
Figure 10:
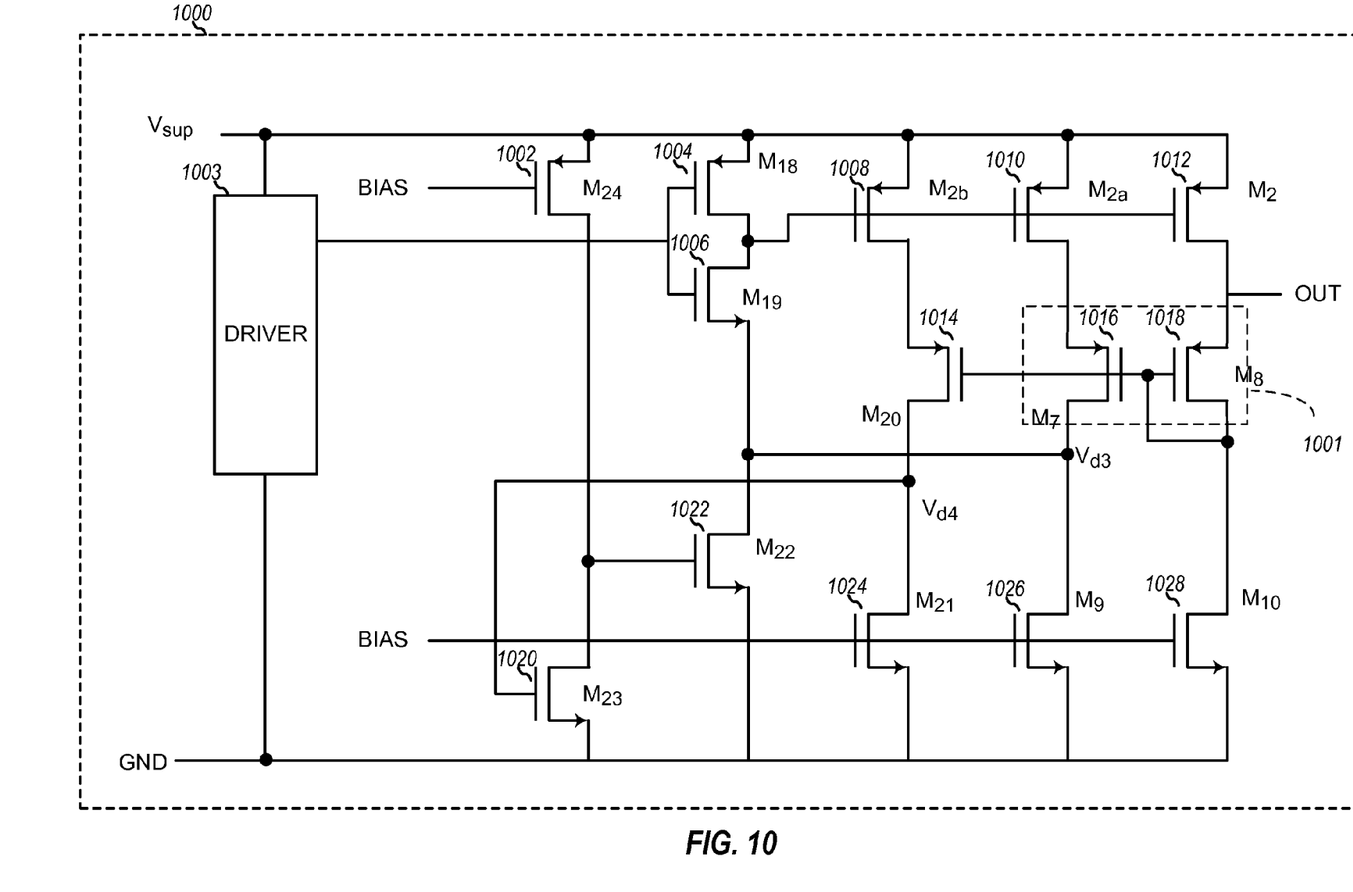
FIG. 10 shows a switched output stage for use as an independent and separate complementary switched output stage to the switched output stage 900 of FIG. 9.

It is herein noted that a switch output stage with only one output transistor M1 308 and its respective short-circuit protection is shown. A second operational amplifier would be needed to measure the drain voltage and protect a second output transistor, which would be applied through a feedback loop to the drain terminal of a second measuring transistor. An example of a second transistor configured in complementary transistor manner is shown in FIGS. 5 and 10 in connection with alternate embodiments described further below.

It should be understood that like labeled components (e.g., M1, M2, M3, etc.) are intended to represent similarly arranged and functioning components as those in later figures with same designations. In each instance, different reference numerals may be used to represent similar components across the figures. This is done for ease of reference only and no differences are otherwise implied or suggested except for obvious technical differences that would be well understood by one skilled in the art.

Figure 4:
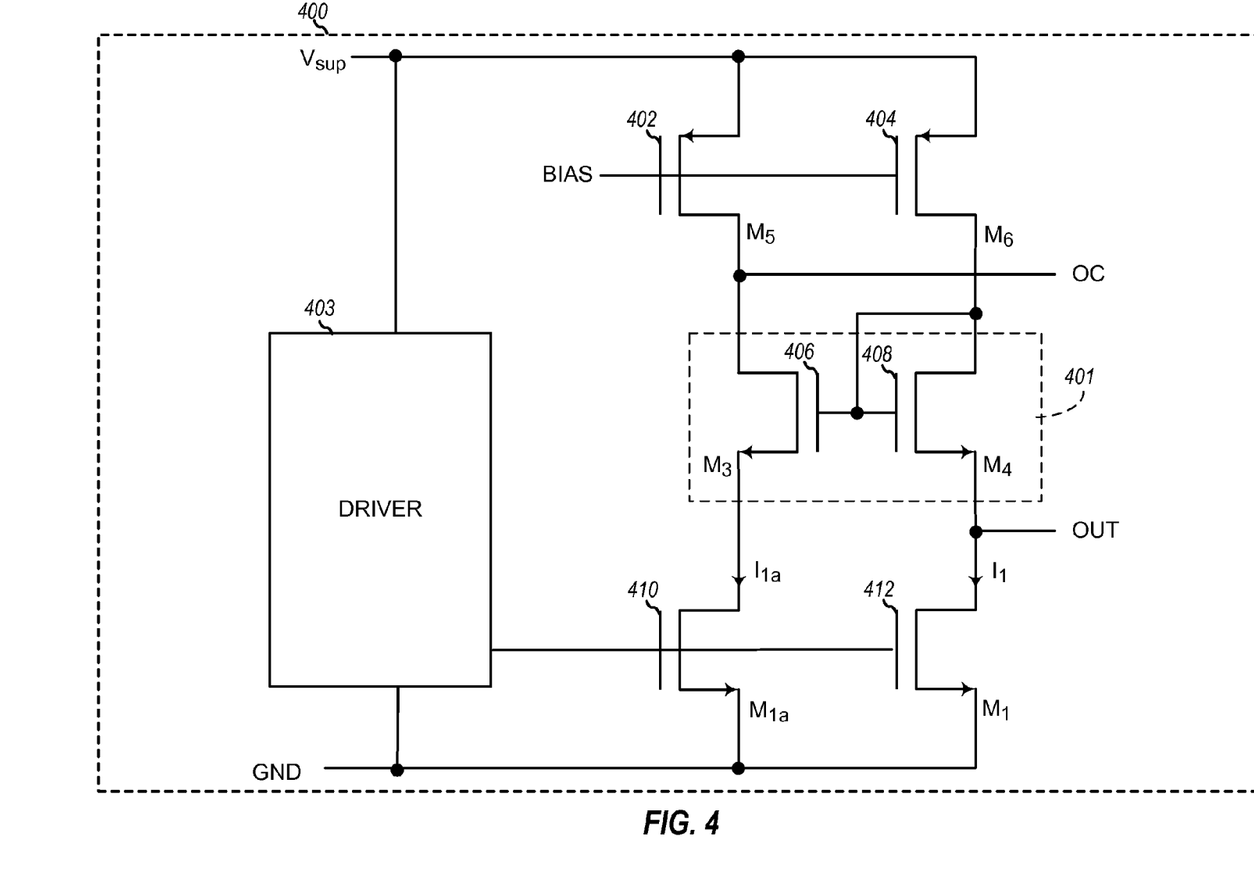
FIG. 4 shows an exemplary embodiment of a switched output stage in accordance with a second exemplary embodiment where the operational amplifier of FIG. 3 is implemented as a single transistor configuration.

FIG. 4 shows an exemplary embodiment of a switched output stage 400 in accordance with a second exemplary embodiment where the operational amplifier of FIG. 3 is implemented as a single transistor configuration.

Here, drain equalization circuit 401 is shown comprised of transistor M3 406 coupled to a single transistor $M_4$ 408, the latter replacing the operational amplifier $A_1$ 302 shown in FIG. 3. A pair of current sources is implemented utilizing transistors $M_5$ 402 and $M_6$ 404 coupled to supply voltage Vsup, and function to regulate the current supplied into the switched output stage 400, and in particular, into current detecting transistor 410.

In the event the output current $I_1$ is less than a protection threshold value and current $I_{1a}$ is less than the nominal current delivered by transistor $M_5$ 402, the over current voltage at node OC is high at a value approximately equal to a supply voltage Vsup. In the event the output current I1 is greater than the protection threshold value, the nominal value of I1a is greater than the nominal drain current of transistor $M_5$ 402. This in turn drives node OC to a voltage level close to ground. Node OC is, therefore, at a higher voltage level under normal operation conditions, and at a lower voltage level when the output stage delivers current greater than the threshold value.

Driver 403, which is coupled to node OC, uses the detected voltage level at node OC to switch output transistor $M_1$ 412 off, and thus protect output transistor $M_1$ 412 against short-circuit currents. It is herein noted that short-circuit protection for only output transistor $M_1$ 412 is shown.

FIG. 5 is a further exemplary embodiment of a switched output stage 500 with two output transistors M1 and M2 (524, 514), where each output transistor is short-circuit protected by a switched output stage configuration similar to that of FIG. 4.

As shown, the second output transistor M2 514 of switched out stage 500 is protected in a similar manner as first output transistor M1 524, which is configured and operates in the same manner as output transistor M1 412 of FIG. 4.

Here, two drain equalization circuits are provided 501 and 501a, comprised of transistors M3, M4 (506, 508) and M7, M8 (516, 518), respectively.

Drain equalization circuit 501a sets the drain voltages of transistors $M_2$ 514 and $M_{2a}$ 512 to the same voltage. Given that the drain voltages of $M_2$ 514 and $M_{2a}$ 512 are set to the same voltage level, the current in transistor $M_{2a}$ 512 is an accurate scaled measure of the current in transistor $M_2$ 514. When the current flowing in transistor $M_2$ 514 is greater than a threshold value, a second over current voltage at node OC2 becomes high with a value approximately equal to Vsup which corresponds to the power supply voltage. The signals OC and OC2 communicate over-current conditions to driver 590, which reacts by reducing the output current. Driver 590 reduces the output current by reducing the drive voltages of transistors $M_1$ 524 and $M_2$ 514. Alternatively, driver 590 may reduce the output current by switching output transistors $M_1$ 524 or $M_2$ 514 to an off state.

Figure 6:
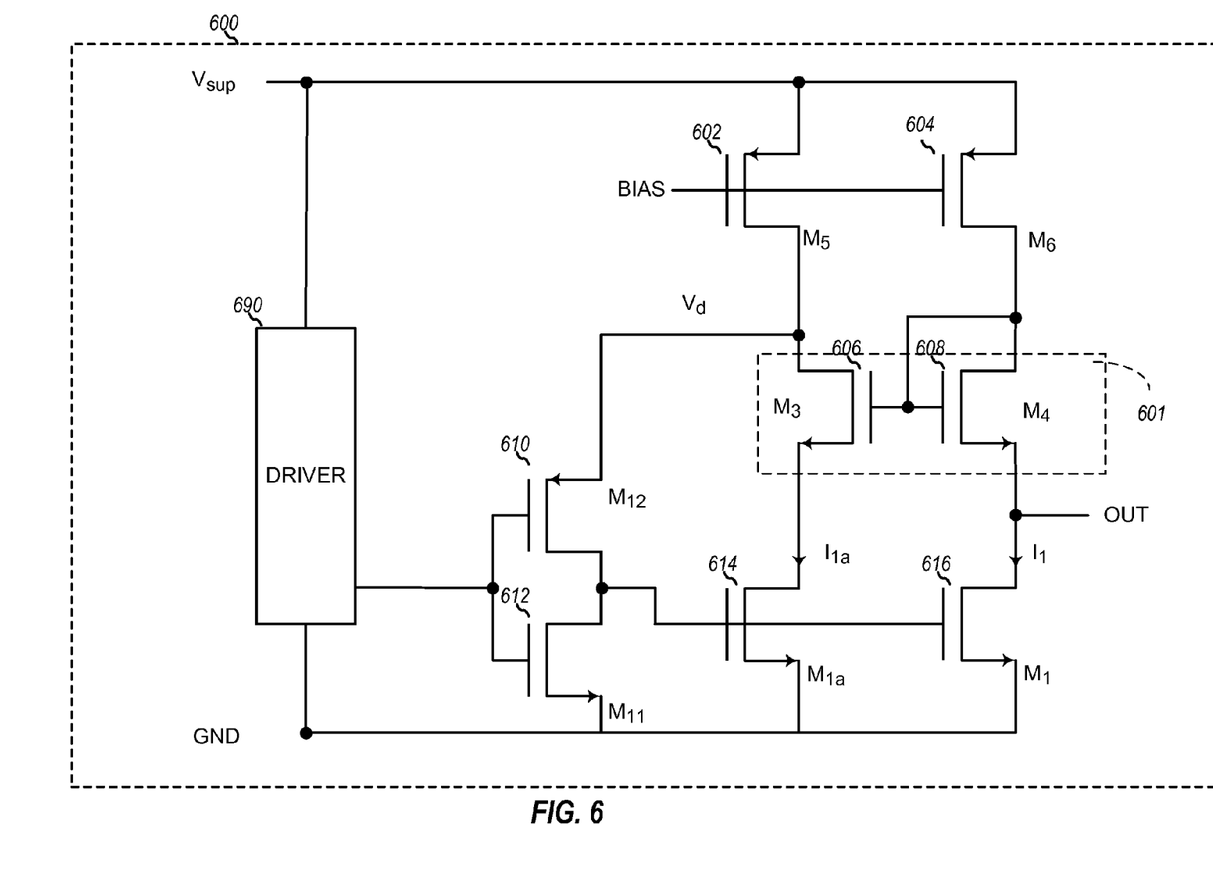
FIG. 6 is an exemplary embodiment of a switched output stage similar to that of FIG. 5, but shown with an inverter in feedback configuration to independently regulate output current.

FIG. 6 is a further exemplary embodiment of a switched output stage 600 similar to that of FIG. 5, but shown with an inverter in feedback configuration to independently regulate output current.

In FIG. 5, current regulation is provided by limiting the output current through intervention of driver 590. In FIG. 6, driver output current is regulated independently of driver 690. Here, feedback is used to regulate the output current. In normal operation, voltage $V_d$ is close to the supply voltage. This voltage powers an inverter, which consists of transistors $M_{11}$ 612 and $M_{12}$ 610. If the input voltage of this inverter is low, $M_{12}$ 610 is in an on state and $M_{11}$ 612 in an off state. When in the on state, $M_{12}$ 610 couples the gate of $M_1$ to $V_d$, thus setting transistor $M_1$ 616 to an on state. In the event the current in transistor $M_1$ 616 becomes too large, the current in transistor $M_{1a}$ 614 becomes larger than the nominal current delivered by transistor $M_5$ 602. This reduces $V_d$ and the gate voltage of transistor $M_1$ 614 until the current in transistor $M_{1a}$ 614 equals the current delivered by transistor $M_5$ 602. This will limit the current in transistor $M_1$ 616 to the current delivered by transistor $M_5$ 602, multiplied by the scale factor between transistors $M_1$ 616 and $M_{1a}$ 614.

In the event transistor $M_1$ 616 is a large transistor with a large gate capacitance, transistor $M_5$ 602 has to deliver a large amount of charge to the gate of transistor $M_1$ 616 in order to switch transistor $M_1$ 616 to an on state. The current that transistor $M_5$ 602 delivers may not be enough to charge the gate of transistor $M_1$ 616 in an acceptable amount of time. A circuit with capable of boosting the current provided may be desirable in such circumstances.

Figure 7:
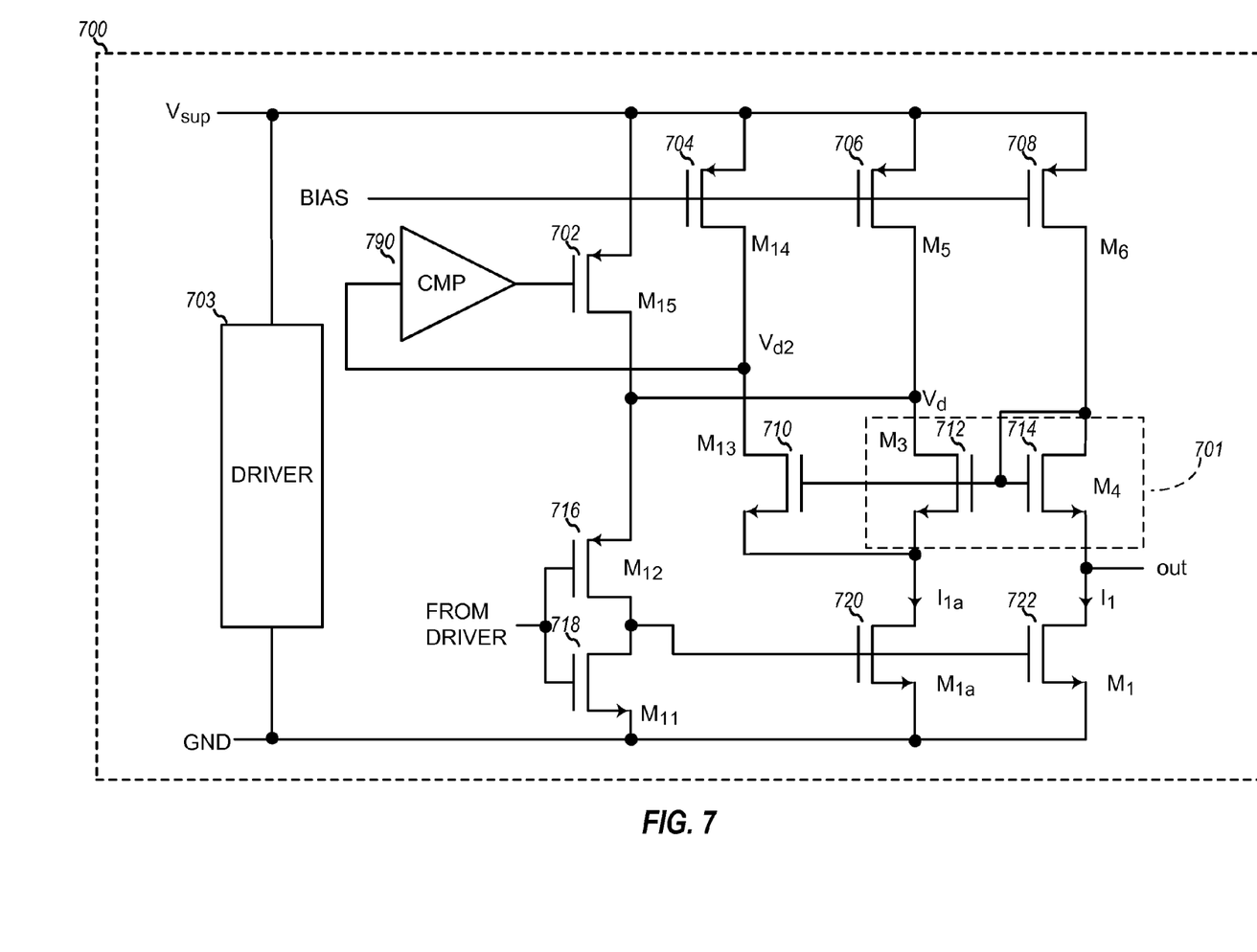
FIG. 7 shows an exemplary embodiment of a switched output stage similar to that of FIG. 6, provided with boost current capability.

FIG. 7 shows an exemplary embodiment of a switched output stage 700 similar to that of FIG. 6, provided with boost current capability.

Here, transistors $M_{13}$ 710 and $M_{14}$ 704 provide an extra output $V_{d2}$ of the short-circuit detector. Transistor $M_{15}$ 702 provides extra current to output transistor $M_1$ 722. The extra current provided by transistor $M_{15}$ 702 is controlled by the voltage at the output $V_{d2}$ through a comparator 790. The additional bias circuit provides increased current so as to supply the large amount of charge to the gate of transistor $M_1$ 722 in the event that transistor $M_1$ 722 is a large transistor with large gate capacitance.

Switched output stage 700 also includes current boosting control circuit comprised of transistor $M_{15}$ 702 and comparator 790. The source of $M_{15}$ 702 is coupled to Vsup while the drain terminal of transistor $M_{15}$ 702 is coupled to the source of transistor $M_{12}$ 716 and to the drain terminal of transistor $M_5$ 706. The gate terminal of transistor $M_{15}$ 702 is in turn coupled to the output terminal of comparator 790. Node Vd2 is coupled to the input of comparator 790. A reference voltage (not shown) is also coupled to an input of comparator 790.

It is noted herein, it may be advantageous to set the comparison level such that the comparator reacts to a voltage change at node $V_{d2}$.

In normal operation, switch $M_{15}$ 702 is closed and realizes a low-resistance path to provide current to the gate of transistor $M_1$ 722. The current $I_{1a}$ is split between transistors $M_3$ 712 and $M_{13}$ 710. In an over-current situation, current $I_{1a}$ is large enough to reduce the voltage at node $V_{d2}$. Comparator 790 detects this and opens transistor $M_{15}$ 702 to an off state. Once transistor $M_{15}$ 702 is in an off state, transistor $M_3$ 712 controls the voltage at node $V_d$ and through it regulates the current in transistor $M_1$ 722 in the same fashion as switched output stage 600 in FIG. 6 described above.

It should be appreciated that the comparator 790 shown in FIG. 7 may be implemented in a variety of transistor configurations.

Figure 8:
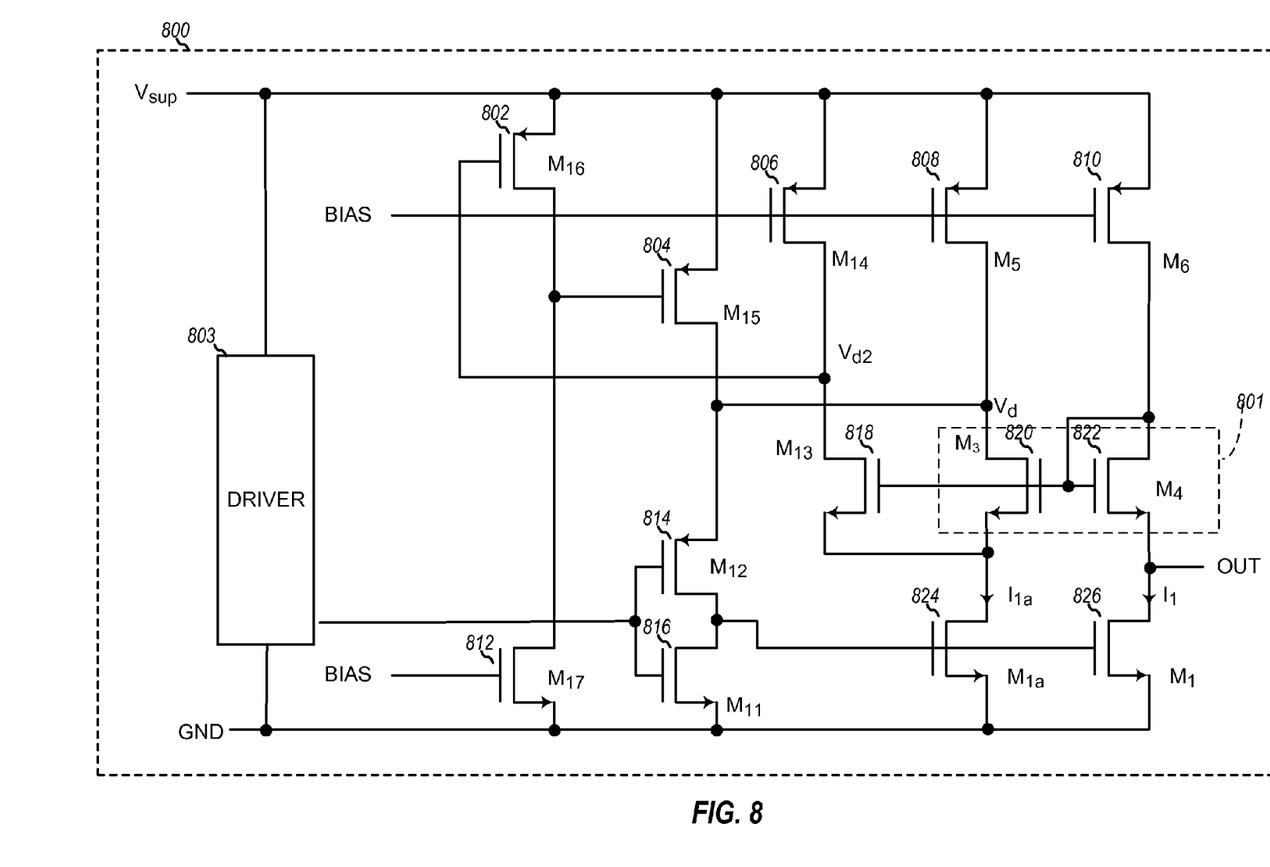
FIG. 8 is a further exemplary embodiment of a switched output stage similar to that of FIG. 7, with additional transistors used in place of the comparator.

FIG. 8 shows an exemplary embodiment of a switched output stage 800 similar to that of FIG. 7, with transistors $M_{16}$ 802 and $M_{17}$ 812 used in place of comparator 790.

Here, transistors $M_{16}$ 802 and $M_{17}$ 812 replace the comparator 790 shown in FIG. 7. The source terminal of transistor $M_{16}$ 802 is coupled to Vsup while the drain terminal of transistor $M_{16}$ 802 is coupled to the drain terminal of transistor $M_{17}$ 812 and to the gate terminal of transistor $M_{15}$ 804. The gate terminal of $M_{16}$ 802, in turn, is coupled to node $V_{d2}$. The gate terminal of transistor $M_{17}$ 812 is coupled to a bias reference voltage.

M16 and M17 detect the voltage present on node $V_{d2}$. When the voltage present at node Vd2 falls below a threshold voltage, the voltage at the drain terminal of transistor $M_{16}$ 802 becomes high, thus forcing transistor $M_{15}$ 804 to an off state. Once transistor $M_{15}$ 804 is in an off state, transistor $M_3$ 820 controls the voltage at node Vd and through it regulates the current in transistor $M_1$ 826 in the same fashion as switched output stage 700 in FIG. 7 described above.

When the voltage present at node Vd2 rises above the threshold voltage, the voltage at the drain terminal of transistor $M_{16}$ 802 becomes low, thus forcing transistor $M_{15}$ 804 to an on state. Once transistor $M_{15}$ 804 is in an on state, it controls the voltage at node Vd and charges the gate of transistor $M_1$ 826 to the supply voltage, controlling it to an on state.

Figure 9:
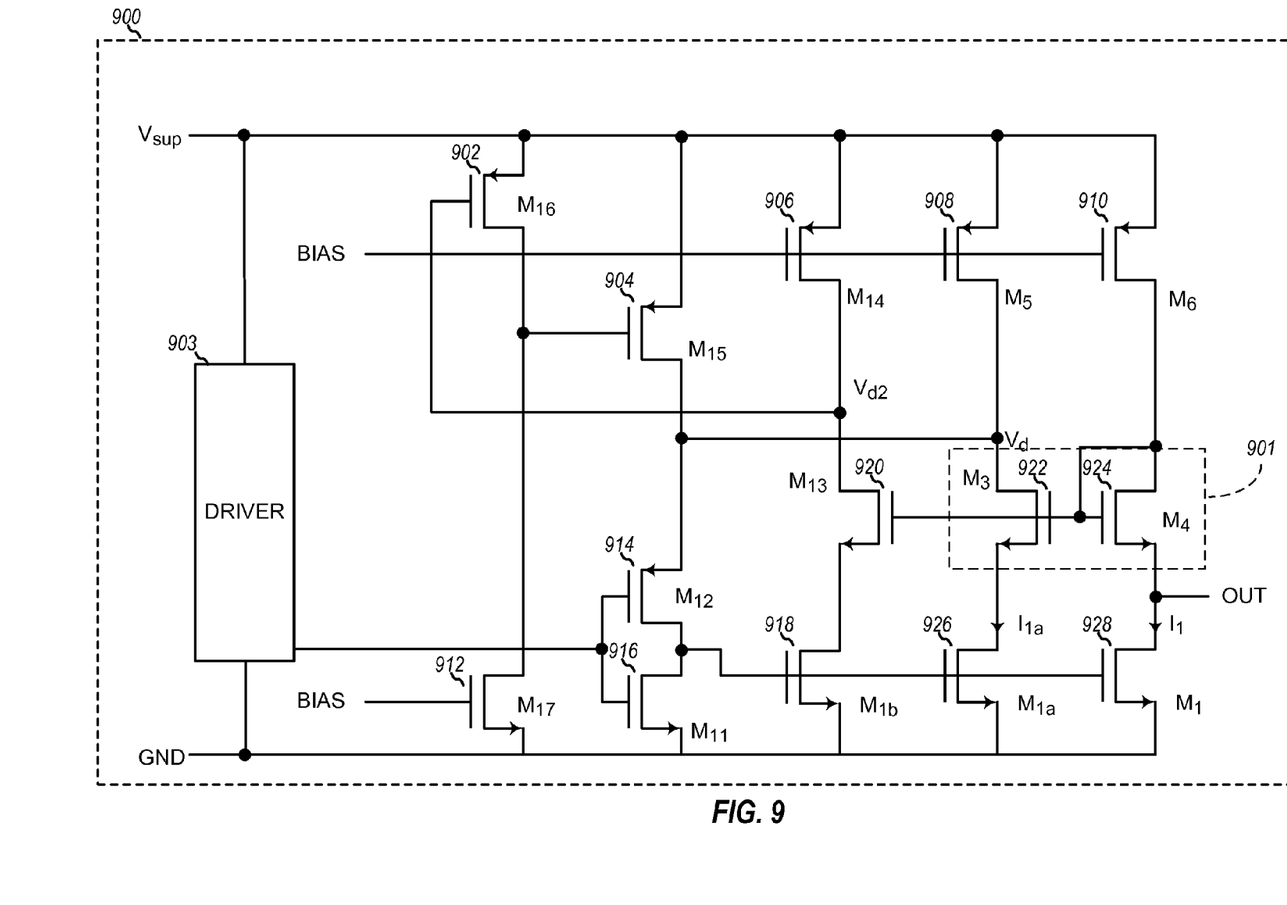
FIG. 9 is a further exemplary embodiment of a switched output stage similar to that of FIG. 8, including independent bias.

FIG. 9 is a further exemplary embodiment of a switched output stage 900 similar to that of FIG. 8, including independent bias.

Here, an additional transistor $M_{1b}$ 918 is coupled to the source of transistor $M_{13}$ 920 to provide a supply current which serves to independently bias M13. By utilizing an additional transistor $M_{1b}$ 918 this way, more accurate control of the current flowing through transistor $M_{13}$ 920 is provided.

FIG. 10 shows a switched output stage 1000 for use as an independent and separate complementary switched output stage to the switched output stage 900 of FIG. 9. As can be readily appreciated, the arrangement of transistors in switched output stage 1000, are reversed compared to similarly arranged transistors in switched output stage 900 to short-circuit protect output transistor M2 1012 which is configured to operate as complementary to output transistor M1 928.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A switched output stage with short-circuit protection for an output transistor, comprising:
   a current detecting transistor coupled in parallel with the output transistor;
   a drain voltage equalization circuit coupled to the output transistor and the current detecting transistor such that the voltages present at each terminal of the output transistor are present at each corresponding terminal of the current detecting transistor; and
   an inverter coupled to the drain voltage equalization circuit to receive a feedback signal therefrom indicative of an excess current condition in the output transistor, and providing an inverter output voltage to the output transistor to short circuit protect it responsive to the feedback signal.

2. The switched output stage of claim 1, further comprising a current regulator circuit to regulate the current through the current detecting transistor.

3. The switched output stage of claim 2, wherein the switched output stage includes at least two output transistors.

4. The switched output stage of claim 2, wherein the inverter comprises:
   a first transistor having a source coupled to the drain voltage equalization circuit to receive the feedback signal; and
   a second transistor having a gate coupled to a gate of the first transistor, a drain coupled to a drain of the first transistor and to gates of both the output transistor and the current detecting transistor, to provide the inverter output voltage to short circuit protect the output transistor.

5. The switched output stage of claim 4, wherein:
   the drain voltage equalization circuit comprises third and fourth transistors with gates coupled together, the third transistor having a source coupled to a drain of the output transistor and a drain coupled to its gate, and the fourth transistor having a source coupled to a drain of the current detecting transistor; and
   the source of the first transistor is coupled to a drain of the fourth transistor to receive the feedback signal.

6. The switched output stage of claim 4, further comprising means, separate from the current regulator circuit, for boosting the current.

7. The switched output stage of claim 6, wherein the means for boosting the current comprises means for providing a bias current to the switched output stage.

8. The switched output stage of claim 7, wherein:
   the means for boosting includes a comparator and a switch
   the drain voltage equalization circuit is coupled between the current regulator circuit and a circuit part comprising the current detecting transistor coupled in parallel with the output transistor; and
   the switch is coupled in parallel with the current regulator.

9. The switched output stage of claim 8, wherein the comparator comprises at least one transistor.

10. The switched output stage of claim 7, wherein the bias current is independently set.

11. The switched output stage of claim 7, wherein the switched output stage includes at least two output transistors.

12. The switched output stage of claim 1, wherein the switched output stage includes at least two output transistors.

13. A switched output stage with short-circuit protection for an output transistor, comprising:
   a current detecting transistor coupled in parallel with the output transistor; and
   a drain voltage equalization circuit coupled to the output transistor and the current detecting transistor such that the voltages present at each terminal of the output transistor are present at each corresponding terminal of the current detecting transistor;
   wherein the drain voltage equalization circuit comprises first and second transistors with gates coupled together, the first transistor having a source coupled to a drain of the output transistor and a drain shorted to its gate, and the second transistor having a source coupled to a drain of the current detecting transistor.

14. The switched output stage of claim 13, further comprising a current regulator circuit to regulate the current through the current detecting transistor, wherein the drain voltage equalization circuit is coupled between the current regulator circuit and a circuit part comprising the current detecting transistor in parallel with the output transistor, the drain voltage equalization circuit generating an over current detection signal which is used to adjust a driver.

15. The switched output stage of claim 14, wherein the driver adjusts the current of the output transistor in response to the over current detection signal.

16. The switched output stage of claim 13, further comprising an inverter coupled to the output transistor.

17. The switched output stage of claim 16, wherein the inverter adjusts the output transistor current in response to an over current detection signal.

18. The switched output stage of claim 16, further comprising means for boosting the current.

19. The switched output stage of claim 18, wherein the means for boosting the current comprises means for providing a bias current to the switched output stage.

20. The switched output stage of claim 19, wherein the means for boosting includes a comparator and a switch.

21. The switched output stage of claim 20, wherein the comparator comprises at least one transistor.

22. The switched output stage of claim 21, wherein the bias current is independently set.

23. The switched output stage of claim 22, wherein the switched output stage includes at least two transistors.

24. A switched output stage with short-circuit protection for an output transistor, comprising;
   means for measuring the current of the output transistor;
   means for setting the voltage at the terminals of the output transistor; and
   means for regulating the current of the output transistor
   wherein the means for regulating includes inverter means coupled to the means for setting and means for measuring, the inverter means receiving a feedback signal indicative of an excess current condition in the output transistor, and providing an inverter output voltage to the output transistor to short circuit protect it responsive to the feedback signal.

25. The switched output stage of claim 24, wherein the means for regulating further comprises current regulating circuit means; and,
   and the means for setting is coupled between the current regulating circuit means and the output transistor.

26. The switched output stage of claim 25, further comprising means for providing bias current to the switched output stage during normal operation, and for not providing bias current during over current operation.

27. A device including a switched output stage with short-circuit protection for an output transistor, comprising:
   a current detecting transistor coupled in parallel with the output transistor;
   a drain voltage equalization circuit coupled to the output transistor and the current detecting transistor such that the voltages present at each terminal of the output transistor are present at each corresponding terminal of the current detecting transistor; and an inverter coupled to the drain voltage equalization circuit to receive a feedback signal therefrom indicative of an excess current condition in the output transistor, and providing an inverter output voltage to the output transistor to short circuit protect it responsive to the feedback signal.

28. The device of claim 27, wherein the device is a wireless communication device.

29. The device of claim 27, wherein the device is an integrated circuit.

* * * * *